United States Patent [19]

Gatto

[11] 4,204,608
[45] May 27, 1980

[54] ACCESS PANEL WITH NON-DESTRUCTIVE RELEASE

[75] Inventor: Donald F. Gatto, Sunrise, Fla.

[73] Assignee: Motorola, Inc., Schaumburg, Ill.

[21] Appl. No.: 26,620

[22] Filed: Apr. 2, 1979

[51] Int. Cl.² ............................................. B65D 43/24
[52] U.S. Cl. .................................... 220/335; 220/343
[58] Field of Search ....................... 220/334, 335, 343; 16/134, 142, 145, 183

[56] References Cited

U.S. PATENT DOCUMENTS 4,106,663  8/1978  Nakao ............................... 220/343 X
4,114,236  9/1978  Vandervort ...................... 220/335 X

*Primary Examiner*—George T. Hall
*Attorney, Agent, or Firm*—Margaret Marsh Parker; James W. Gillman

[57] ABSTRACT

An access panel as for a small apparatus housing has a pivot pin with retracting ends for cooperating with a fixed point socket during normal operation. Excess force causes the pivot pin to translate onto a camming surface, which leads to the outer surface of the housing whereby the pin ends retract, and the door is released without damage.

6 Claims, 10 Drawing Figures

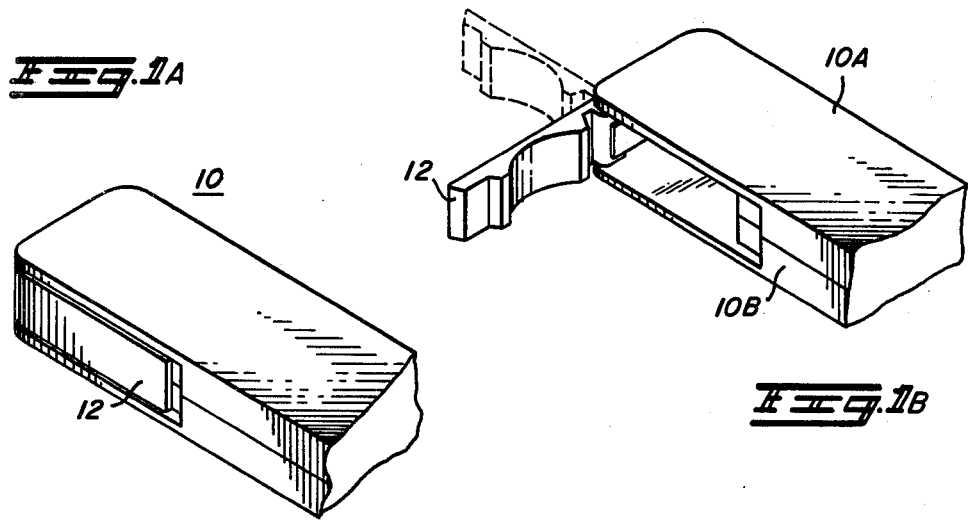
FIG. 1A
FIG. 1B
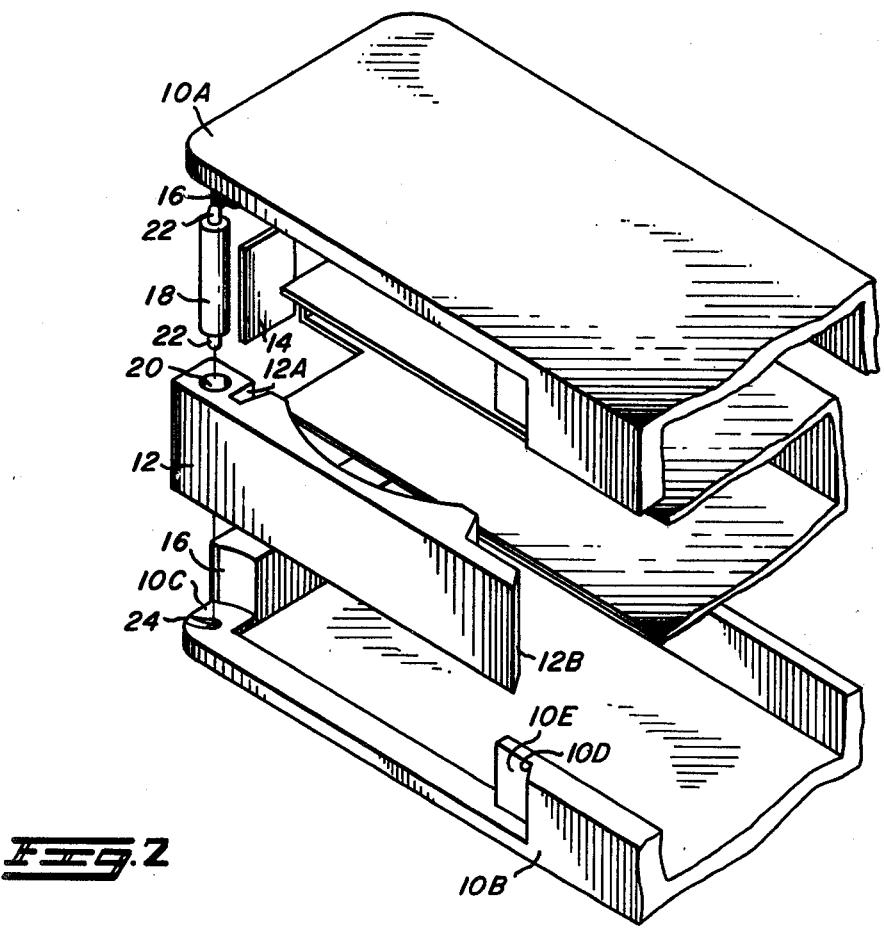
FIG. 2

ACCESS PANEL WITH NON-DESTRUCTIVE RELEASE

BACKGROUND OF THE INVENTION

This invention relates to the field of apparatus housings and, more particularly, to a housing access door which will be released without damage when opened beyond a detent stop.

Many types of access doors or panels have been designed for small apparatus housings. As the size of the housing becomes smaller, wall thickness decreases and it becomes more difficult to design an access door with sufficient strength to withstand the application of excessive force. In miniature electronic devices, relatively easy access is required for battery compartments, typically the only portion of the device accessed by the user or other unskilled personnel. Such devices often have housing parts molded of high impact plastic, and are extremely strong for their small size. However, when a part such as the battery access door is broken, the device is usually inoperable and must be returned to a factory service center where the housing can be replaced. When the device is a unit such as a personal pager, the user is greatly handicapped in his daily schedule when his own pager is disabled. It would therefore be high desirable to provide a housing with an access door which could withstand extreme force without either being damaged.

SUMMARY OF THE INVENTION

It is therefore an object of the present invention to provide, in a miniature housing, an access door or panel which can withstand forces strong enough to separate the door from the housing without damage to either.

This and other objects are provided in a housing with an access door which is retained by a hinge pin having retractible ends. These ends mate with socket recesses in the housing until the door is opened past intermediate detent positions to a full stop position. Any further force applied will cause the stop element to act as a fulcrum and the hinge pin ends will be forced out of the socket recesses and onto adjacent camming surfaces. As the pins ride up the camming surfaces, the ends are forced back into the body of the pin, eventually releasing the door intact. The door can then be replaced by applying force in a reverse sequence.

BRIEF DESCRIPTION OF THE DRAWING

FIGS. 1A and 1B are views of a miniature housing showing an access door closed and opened in two different positions.

FIG. 2 is an exploded view of a portion of the housing of FIG. 1.

DETAILED DESCRIPTION OF A PREFERRED EMBODIMENT

Figure 3:
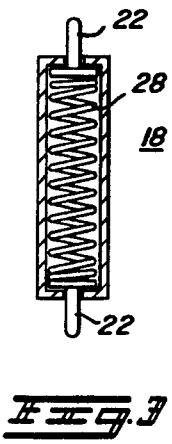
FIG. 3 is a partial cut-away view of the hinge pin of FIG. 2 along the axis thereof.

FIGS. 1A and 1B are views of a housing, such as for a miniature electronic device, having an access door as for a battery compartment. No battery or electrical connectors are shown since they form no part of the present invention. It is to be understood that the invention is not limited to any particular housing configuration, type of apparatus or size of housing.

In FIG. 1A a housing, indicated generally by reference numeral 10, is shown with an access door 12 in the closed position. The door 12 is designed for a flush fit when closed, with no hinge apparent. In FIG. 1B, the door 12 is shown in an open position as for battery replacement, with dashed lines indicating the fully open position of the door 12. Both positions shown in FIG. 1B are under the control of a detent 14 (see FIGS. 2 and 4), the dashed line position being against a stop/fulcrum 16 (see FIG. 4D).

FIG. 2 is an exploded view of the housing 10 having an upper portion 10A and a lower portion 10B. The housing may be formed of any strong material suitable for the particular application. A hinge pin 18 is shown aligned with a throughbore 20 in the door 12 in which the pin 18 would be inserted with a press fit. The pin 18, as may be seen in the cut-away view of FIG. 3, has retractible protruding end portions 22. For very small housings, the pin 18 may be of the type used to retain wrist watch bands.

Figure 5:
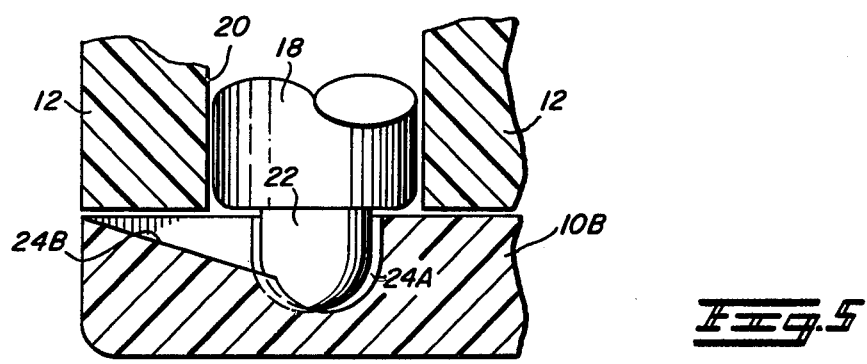
FIG. 5 is a cut-away side view of a portion of FIG. 4D along the line 5—5.

When the housing 10 is fully assembled, the end portions 22 of the hinge pin 18 are seated in a pair of recesses 24 (one shown), one in each housing half 10A, 10B. Each recess 24 has two portions, a fixed position socket 24A and a camming surface 24B (see FIG. 5). Under normal operating conditions the end portions 22 of the hinge pin 18 remain seated in the respective fixed position sockets 24A, as the door 12 moves from the closed door position of FIG. 1A to the position against the stop/fulcrum 16 (dashed line) of FIG. 1B. The camming surfaces 24B extend from the wall of the socket 24A, near but not at the bottom of the socket, and rise toward a housing surface 10C at a point near the stop/fulcrum 16.

The door 12 includes a slot or recess 12A for receiving and cooperating with a detent/return spring 14 which may form a part of or be retained within the housing 10. The spring 14 must, of course, be formed of a strong resilient material such as spring steel or piano wire. The detent action is fully explained hereinbelow with respect to FIG. 4. The opening edge of the door 12 has an inwardly inclined surface 12B which matches but need not contact an outwardly inclined surface 10D on the housing. In a miniature housing, a fingernail inserted between surface 12B and surface 10D would allow the door 12 to be opened.

FIG. 3 is a view of a preferred embodiment of the hinge pin 18 and shows the cut-away body of pin 18 retaining a cylindrical coil spring 28, and the two protruding end portions 22. As is known, the end portions 22 may be retracted under force to a position within or nearly within the body of the pin 18, and will return to the outermost position upon the release of the applied force.

Figure 4A:
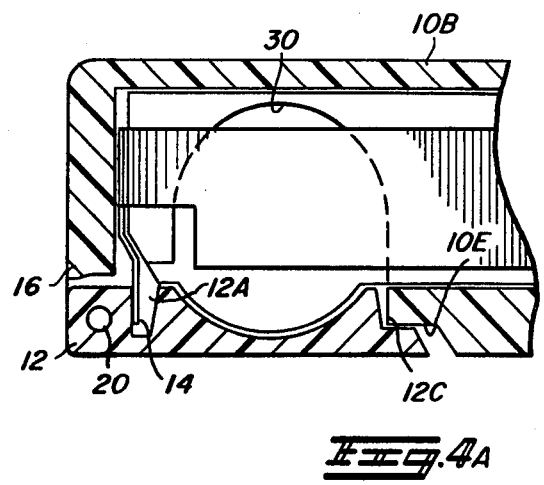
FIGS. 4A–4E are cut-away top views of a portion of the housing of FIG. 1 showing the access door in five possible positions.

FIGS. 4A–4E are cut-away partial views of the housing 10 and door 12 showing five different positions of the door and the relevant action of the detent spring 14. In FIG. 4A, the door is in the closed position of FIG. 1A. The battery compartment 30 is indicated. The detent/return spring 14 is shown exerting a force against a first wall of the recess 12A, retaining the door 12 in the closed position. An inward surface 12C of the door 12 is in contact with an outward-facing surface 10E of the housing 10, providing a positive stop action when the detent spring 14 pulls the door closed.

Figure 4B:
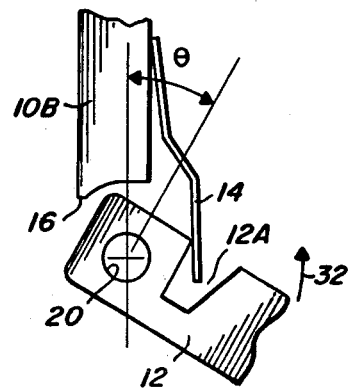

In FIG. 4B, the door 12 has been opened and moved through an angle $\theta$ less than 45°. The detent/return spring 14 is exerting a counterclockwise force (arrow 32) on an edge of a recess 12A, tending to close the door 12.

Figure 4C:
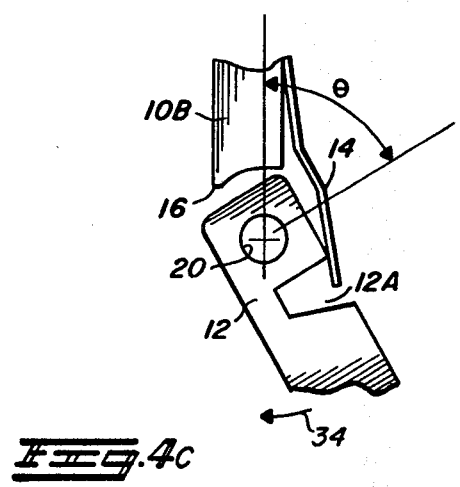

In FIG. 4C, the door 12 has been opened through an angle $\theta$ greater than 45° but less than 90°. The detent/return spring 14 is now exerting a clockwise force (arrow 34) on the door 12, urging the door toward the detent position; i.e., $\theta = 90°$.

Figure 4D:
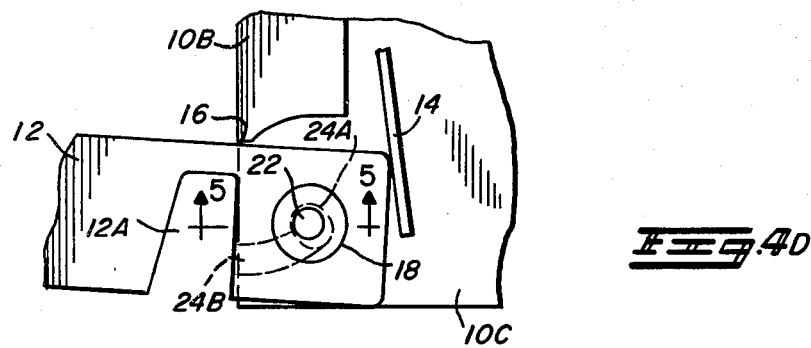

In FIG. 4D, the door 12 has been opened through an angle $\theta$ slightly greater than 180°. As the door is moved beyond $\theta = 90°$, the detent spring 14 would tend to return the door to the first detent position until $\theta$ exceeds approximately 135° and is less than 180°. At any $\theta$ greater than 135°, the door 12 would be urged toward the full stop position ($\theta$ approximately equal to 180°) against the stop/fulcrum 16. Movement of the door 12 beyond the full stop position shown in FIG. 4D begins the release procedure.

Figure 4E:
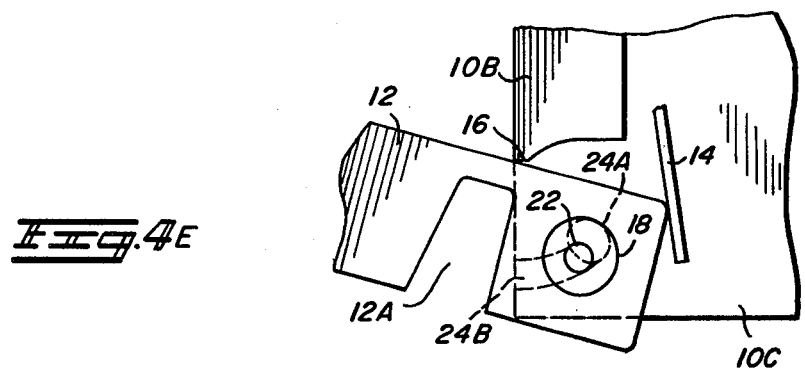

In FIG. 4E, the door 12 has been pushed beyond the full stop position of FIG. 4D. The stop/fulcrum 16 now acts as a fulcrum and the end portions 22 of the hinge pin 18 have been forced out of the sockets 24A in housing halves 10A and 10B. As the pin 18 is moved, the end portions 22 begin to ride up the camming surfaces 24B. The end portions are forced back into the body of the hinge pin 18 and, upon reaching the outer end of the camming surfaces, the door 12 is released from the housing unharmed.

The door 12 can be replaced in the housing by positioning the door as shown in FIG. 4E, displaced slightly clockwise. The pin ends are forced into the body of the pin 18 by entrance into the cam track and the door is rotated gradually toward the closed-door position. The pin ends will gradually extend beyond the body of the pin 18 until they lock into the sockets 24A and the door can then be reclosed.

Thus there has been shown and described an access door for a housing which can be forced open so widely that the door will be completely released with no damage to either door or housing. The door is immediately reattachable after release and can have three detent positions, closed, open 90°, and open "full stop". It is intended to include all variations and modifications which are covered in the appended claims.

What is claimed is:

1. A housing having a cavity therein and having an opening in at least one wall of said cavity and comprising in combination:
    a door panel dimensioned to cooperate with the opening in the cavity wall to enclose said cavity and including hinge means having protruding retractable portions;
    the housing including, adjacent one edge of said cavity wall opening, pivot socket means for retaining said protruding hinge portions, and camming surfaces adjacent the socket means for cooperating with the hinge means to retract said protruding hinge portions when the door panel is pivoted beyond a predetermined position whereby the door panel is released from the housing wall.

2. A housing in accordance with claim 1 wherein the housing further includes a resilient projecting detent member and the door panel includes a first surface positioned to cooperate with the detent member to urge the door panel to a closed position.

3. A housing in accordance with claim 2 wherein the door panel further includes a second surface positioned to cooperate with the detent member to urge the door panel to a first open position.

4. A housing in accordance with claim 3 wherein the door panel further includes a third surface positioned to cooperate with the detent member to urge the door panel to a second open position, the predetermined position being slightly beyond the second open position.

5. A housing in accordance with claim 1 wherein the housing further includes fulcrum means adjacent the one edge of the cavity wall opening for assisting in the release of the door panel.

6. A housing having a cavity therein and having an opening in at least one wall of said cavity and comprising in combination:
    a door panel dimensioned to cooperate with the opening in the cavity wall to enclose said cavity and having a throughbore adjacent the hinge edge of the door panel;
    a hinge pin dimensioned for snug-fit in said throughbore and including spring-loaded, retractible end portions extending beyond the bore;
    the housing further including two recessed portions for receiving the extending end portions of the hinge pin, a camming surface adjacent each recessed portion for cooperating with the pin end portions, and a housing portion adjacent the hinge side of the housing wall opening for providing a stop for the door panel when opened to a predetermined position and providing a fulcrum point when the door panel is opened beyond said predetermined position;
    whereby when the door panel is opened beyond said predetermined position, the extending end portions of the hinge pins are forced out of the recessed portions of the housing and against the respective camming surfaces, retracting said end portions and releasing the door panel from the housing.

* * * * *